United States Patent [19]
Apel et al.

[11] Patent Number: 5,574,411
[45] Date of Patent: Nov. 12, 1996

[54] LUMPED PARAMETER BALUN

[75] Inventors: Thomas R. Apel; Charles E. Page, both of Sunnyvale, Calif.

[73] Assignee: Samsung Semiconductor, Inc., San Jose, Calif.

[21] Appl. No.: 533,294

[22] Filed: Sep. 25, 1995

[51] Int. Cl.[6] .................................................. H03H 7/42
[52] U.S. Cl. ............................................. 333/25; 333/32
[58] Field of Search .............................. 333/25, 32, 100, 333/124; 334/65, 71, 78

[56] References Cited

U.S. PATENT DOCUMENTS 2,013,154  9/1935  Jensen ....................................... 333/25
2,978,578  4/1961  Waring .................................. 333/32 X
3,436,333  4/1969  Beaudry ................................ 333/32 X

OTHER PUBLICATIONS

"Communication Circuits Analysis and Design," Clarke et al., 1971, Addison–Wesley Publishing Co., Reading, Mass, pp. 38–52.

*Primary Examiner*—Paul Gensler
*Attorney, Agent, or Firm*—Townsend and Townsend and Crew LLP

[57]  ABSTRACT

A balun, which does not use magnetic coupling and is easily integrated in MMICs, is formed of lumped parameter inductive and capacitive circuit elements. In one embodiment, a termination circuit is utilized to prevent reflections of common mode signals.

5 Claims, 3 Drawing Sheets

LUMPED PARAMETER BALUN

BACKGROUND OF THE INVENTION

1. Field of the Invention

The invention relates generally to a method or system for interfacing balanced and unbalanced stages in an electronic system and more particularly to interfacing a balanced input stage, providing output signals which are 180° out of phase, and an unbalanced load which driven by a single-ended input signal.

2. Description of the Relevant Art

A power amplifier is an amplifier having an output which is considered in terms of its power capability instead of its voltage or current limitations. Relatively high output power is required when the amplifier is used to operate a motor, drive a loudspeaker or an antenna, or perform some other similar task.

The power developed by the amplifier must be efficiently transferred to a load.

In many instances the power required by the load is more than can be generated by single amplification element such as a transistor. One effective way to connect more than one amplification element to increase power is the push-pull configuration depicted in FIG. 1.

In FIG. 1, a balanced, push-pull amplifier includes two amplification elements 12a and b which are, for example, NPN transistors having their sources coupled to ground and their gates coupled to receive, respectively, first and second input signals which are 180° out-of-phase (odd-mode excitation). In low-frequency push-pull amplifiers, a transformer 14 is typically utilized to couple the balanced, push-pull amplifier 10 to an unbalanced load 16. Thus, the transformer performs the function of a balun, i.e, coupling a balanced, or differential, signal source to an unbalanced, or single-ended, load.

Various input-stages for providing the out-of-phase input signals to the push-pull amplifier, e.g., an active splitter with a differential pair, are well-known in the art. A transformer can also provide this unbalanced to balanced input function. In practice, these input stages may also provide a common mode signal that has the same phase (in-phase or even-mode excitation) at both inputs of the push-pull amplifier. For example, a biasing voltage is often applied as a common mode voltage signal.

Circuit designers need a balun that rejects common mode signals and provide equal balanced and unbalanced port currents and voltage levels. It is also desirable to isolate D.C. voltage levels from the following stage.

The balun functions are typically achieved by utilizing a magnetic coupling. A solution utilizing a magnetically coupled tri-filar balun is depicted in FIGS. 2A and B, where an auto-transformer implementation is depicted.

FIGS. 3A and 3B depict, respectively, how the magnetic coupling causes the rejection of even mode excitations and the transmission of balanced excitations while providing equal balanced and unbalanced port currents.

Although magnetically coupled structures function well as baluns it is very difficult to integrate such structures into integrated semiconductor circuits. Thus, the reduction in size and other beneficial properties of MMICs (monolithic microwave integrated circuits) are not readily realized by baluns utilizing magnetic coupling.

SUMMARY OF THE INVENTION

The present invention is a balun interface circuit and a method for using the circuit that utilizes lumped parameter circuit elements to perform the balun function. No magnetic coupling is required thereby facilitating integration into an MMIC.

According to one aspect of the invention, an inductive element includes first, second, and third inductors, coupled in series, and a capacitive element. The inductive and capacitive elements are coupled to form a parallel LC circuit. Each inductor and the capacitor have first and second terminals and the first terminal of the first inductor is connected to the first terminal of the capacitor at a first node, the second terminal of the first inductor and the first terminal of the second inductor are coupled at a second node, the second terminal of the second inductor and the first terminal of the third inductor are coupled at third node, and the second terminal of the third inductor and the second terminal of the capacitive element are coupled at a fourth node. In operation, the balanced input signal is provided to the first and third nodes, the second node is coupled to ground, and the fourth node is coupled to provide the single-ended output signal.

According to another aspect of the invention, a termination circuit couples the second node to ground and absorbs common mode energy to prevent reflection of received common mode signals.

According to another aspect of the invention, the inductive and capacitive elements are integrated into an MMIC. The inductive elements are in the form of conductors disposed on the surface of an MMIC and the capacitive element is a layered structure integrated into the MMIC.

Other advantages and features of the invention will be apparent in view of the following detailed description and appended drawings.

DETAILED DESCRIPTION OF THE PREFERRED EMBODIMENTS

Figure 1:
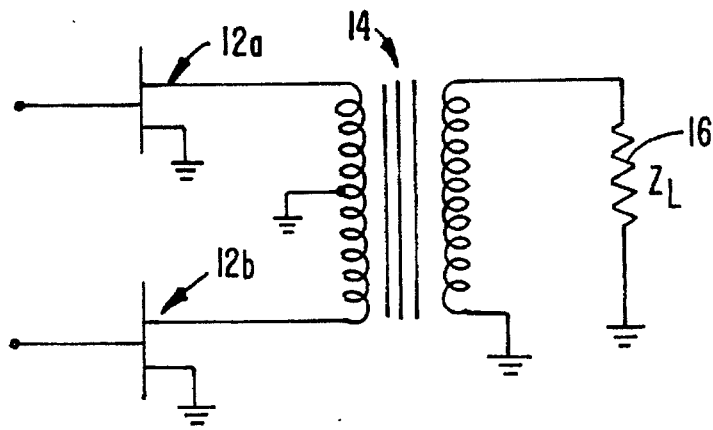
FIG. 1 is a circuit diagram of a push-pull amplification stage driving an unbalanced load.
Figure 2A:
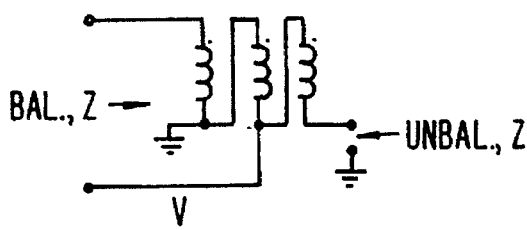
FIGS. 2A and B are circuit diagrams depicting baluns utilizing magnetic coupling.
Figure 2B:
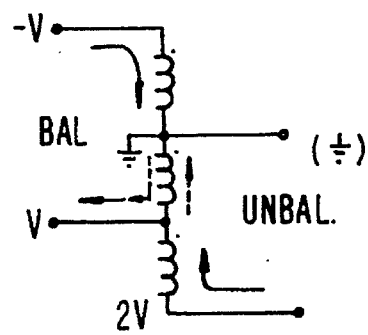
Figure 3A:
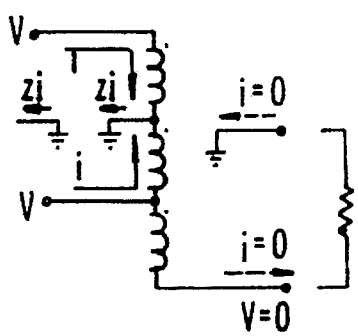
FIGS. 3A and B are circuit diagrams depicting the response of the circuit of FIG. 2B to even-mode and odd-mode excitations.
Figure 3B:
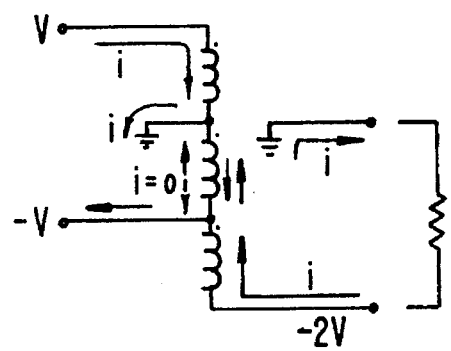
Figure 4:
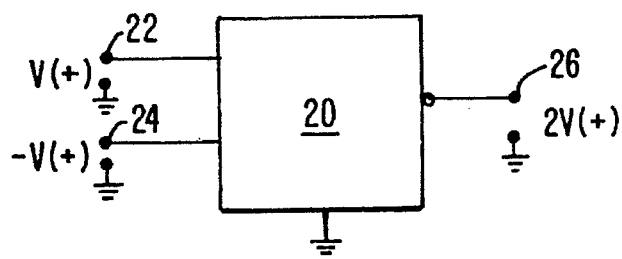
FIG. 4 is a block diagram of a generalized balun.

FIG. 4 is a block diagram of a generalized balun 20 receiving balanced input signals at input ports 22 and 24 and providing a single-ended output signal at the output port 26 for driving an unbalanced load. As depicted, for an odd excitation the instantaneous voltage levels at the first and second ports 22 and 24 are equal to V(t) and −V(t) respectively, and voltage level at the output port is equal to 2V(t) so that the voltage levels across the balanced input ports 22 and 24 and across the unbalanced load are the same.

Additionally, the value of current, I(t), is the same for all ports.

Figure 5:
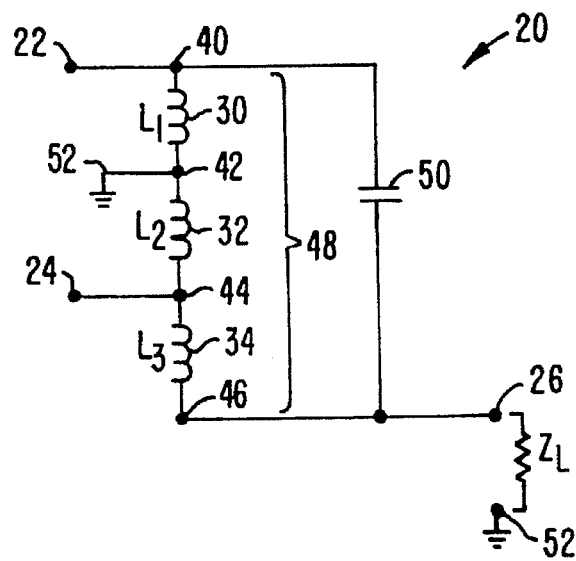
FIG. 5 is a circuit diagram of an embodiment of a balun constructed according to the principles of the invention.

FIG. 5 is a circuit diagram of a balun 20 constructed according to the principles of the invention. The circuit is in the general form of a parallel LC resonant circuit characterized by a resonant frequency, $f_0$, equal to $1/2\pi\sqrt{LC}$. In this embodiment, first, second, and third inductors 30, 32, and 34 have inductances equal to L1, L2, and L3, respectively, so that L=L1+L2+L3.

In FIG. 5, the first inductor 30 has a first terminal coupled to a first node 40 and a second terminal coupled to a second node 42, the second inductor 32 has a first terminal coupled to the second node 42 and a second terminal coupled to a third node 44, and the third inductor 34 has a first terminal coupled to the third node 44 and a second terminal coupled to a fourth node 46. Thus, the first, second, and third inductors 32, 34, and 36 form a series inductive circuit 48 having a total inductance of L.

A capacitor 50, having a capacitance equal to C, has a first terminal connected to the first node 40 and a second terminal connected to the fourth node 46. Thus, the series inductive circuit 48 and the capacitor 50 form the parallel resonant circuit.

The first input signal is coupled to the first node 40 which functions as the first balun input port 22 and the second input signal is coupled to the third node 44 which functions as the second balun input port 24. These antiphased driving signals cause circulating currents to flow in the resonant circuit. The unbalanced load is coupled between the fourth node 46, which functions as the balun output port 26, and a ground terminal 52. The second node 42 is coupled to the ground terminal 52. The voltage levels at the first and second balun input ports 22 and 24 and the balun output port 26 are referenced to ground.

The operation of the embodiment depicted in FIG. 5 will now be described. First, because the impedance of the inductors is very low for low frequencies, DC voltage is passed through the balun. This is advantageous in providing bias to transistors in amplifier circuits. In FIG. 5, the DC and RF ground is at the second node 42. When node 42 is bypassed with a large capacitor to ground, DC biasing can be passed through the balun.

Second, for frequencies near $f_0$, it is known that if part of the inductive element of the resonant circuit is tapped, i.e., a load is connected across only part of the inductive element of the resonant circuit, then the signal developed in the load across the tapped inductor may be modeled by the identical load placed across the secondary of an ideal transformer whose primary is placed in parallel with the total L of the resonant circuit.

Thus, in FIG. 5, at resonance the voltage levels and the port current magnitudes at the unbalanced output port of circuit can be analyzed by considering the load to be connected across the second and third inductors 32 and 34 and modeling the load by the identical load placed across the secondary of an ideal transformer whose primary is placed in parallel with the composite inductive circuit 48. The port current magnitude and voltage level at the balun output port 26 can be controlled by selecting the values of L1, L2, and L3 to determine the turns ratio of the ideal transformer.

By analogy, the magnitude of port current at the differential input ports 22 and 24 of the circuit can be analyzed at resonance by considering the balanced input to be connected across the first and second inductors 30 and 32 and modeling the balanced input by an identical input placed across the primary of an ideal transformer whose secondary is placed in parallel with the composite inductive circuit 48.

The circuit of FIG. 5 works well as long the loaded Q of the resonant circuit 48 remains high or moderate, i.e., the circulating resonance currents are greater in magnitude than the magnitude of port currents I(t). Thus, resonance is utilized to force (approximate) the desired voltage and impedance relationships to be maintained.

Simulation of the performance of the circuit of FIG. 5 near resonance indicates that the transmission ratio for odd excitation signals and the rejection ratio for even excitation signals is high.

For odd mode excitations, the port current through the second inductor 32 is the sum of an input port current flowing between the ground terminal 52 and the second input port 24 and an output port current flowing between the ground terminal 52 and the output port 26. These port currents flow in opposite directions and tend to cancel each other. Thus, the resonant solution can be compensated for better bandwidth by raising the value of L2 above L1 and L3.

In a preferred embodiment of the circuit of FIG. 5 designed to operate at a frequency of about 0.8 GHz, the values of various circuit parameters would be about:

L1 =3.3 microHenry;

L2 =4.7 microHenry;

L3 =5.3 microHenry; and

C =4.2 picoFarad.

Figure 6:
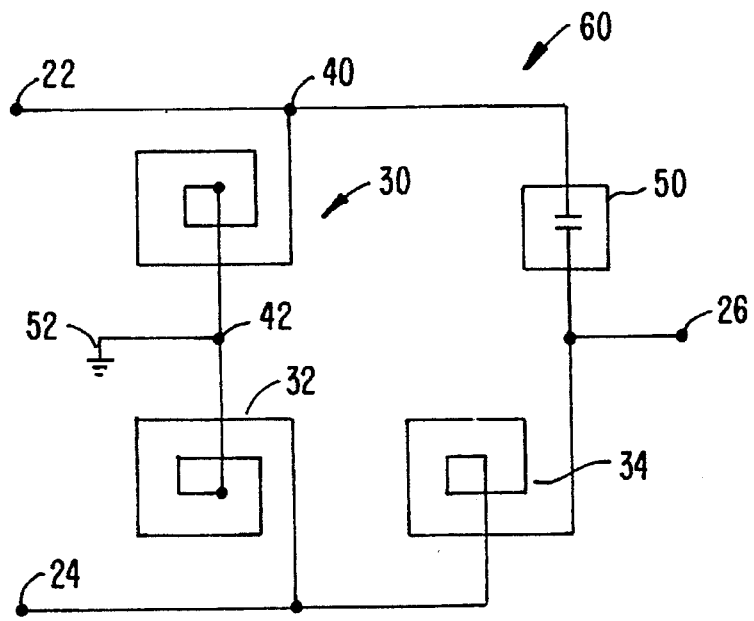
FIG. 6 is a schematic diagram of the circuit of FIG. 5 implemented on an MMIC.

FIG. 6 depicts an integrated embodiment of the circuit depicted in FIG. 5. Referring to FIG. 6, the top surface 60 of a microwave monolithic integrated circuit (MMIC) is depicted with the first, second, and third inductors 30, 32, and 34 being in the form of rectangular spiral conductors and the capacitor 50 in the form of a metal-insulator-metal (MIM) capacitor.

Figure 7:
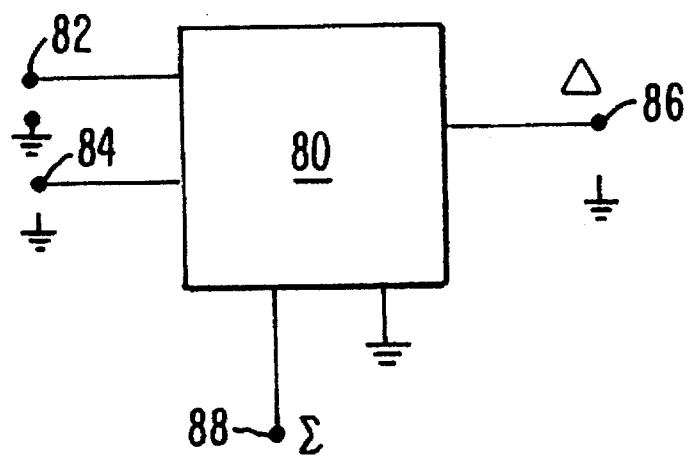
FIG. 7 is a block diagram of a generalized SIGMA/DELTA 4-port hybrid.

FIG. 7 depicts a generalized 4-port hybrid 80 having first and second input ports 82 and 84 for receiving first and second input signals, a single-ended DELTA output port 86 and a single-ended SIGMA output port 88. The generalized coupling element provides a DELTA, or differential, signal, having a magnitude equal to the difference of the magnitudes of the first and second input signals, at the DELTA output port 86, and provides a SIGMA, or common mode, signal, having a magnitude equal to the sum of the magnitudes of the first and second input signals, at the SIGMA output port 88.

The resonant response of the balun circuit of FIG. 5 is similar to the response of the three ports of the SIGMA/DELTA 4-port hybrid element 80 having its first and second input ports coupled to receive the output signals of a balanced stage, its DELTA output port 84 coupled to an unbalanced load. By analogy, the second node 42 corresponds 20 to the SIGMA port 88 and the balun output port 26 corresponds to the DELTA port 86. Thus, because the balun circuit of FIG. 5 rejects even mode excitations, the energy from even mode excitations is reflected back into the balanced input stage. If the SIGMA output port was terminated by an energy absorbing element then the even mode excitation would be absorbed.

Figure 8:
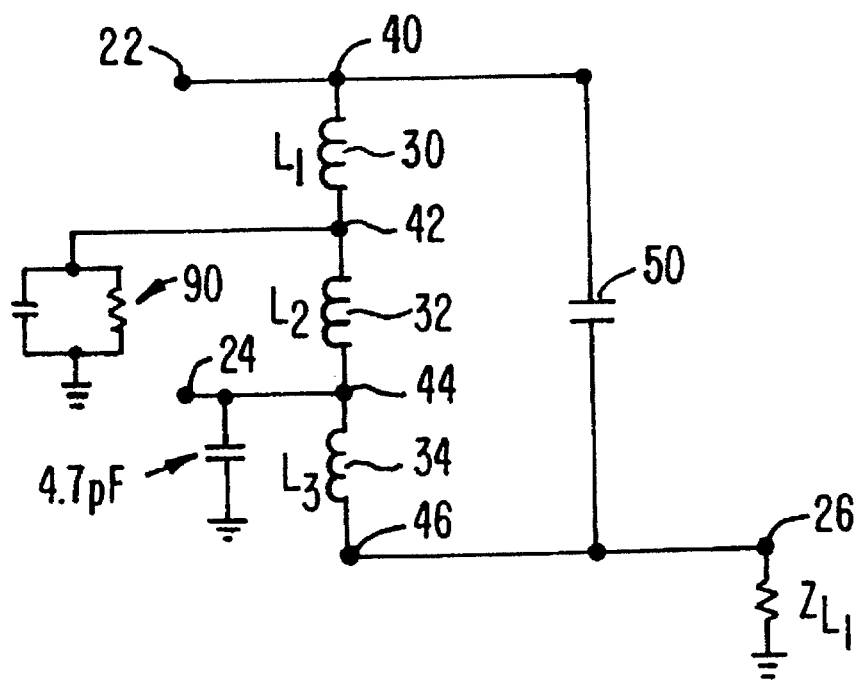
FIG. 8 is a circuit diagram of another embodiment of a balun as a SIGMA/DELTA 4-port hybrid constructed according to the principles of the invention.

FIG. 8 depicts a second embodiment of the invention that includes a termination circuit for preventing reflections of even mode excitations. Referring to FIG. 8, the second node 42 is coupled to ground via a termination circuit 90. In FIG. 8 the termination circuit is a parallel LC circuit that effects cancellation due to anti-phase, equal amplitude signals generated in the circuit. The value of the impedance of the termination circuit is selected so that the even mode excitation energy is absorbed by the termination circuit 90. Thus, the SIGMA/DELTA 4-port hybrid embodiment of FIG. 8 is essentially the 3-port balun of FIG. 5 with an isolation port added for the common or sum mode.

In a preferred embodiment of the circuit of FIG. 8 designed to operate at a frequency of about 0.8 GHz, the values of various circuit parameters would be about:

L1 =12 microHenry;

L2 =15 microHenry;

L3 =12 microHenry; and

C =2.7 picoFarad; and the values of the circuit elements in the termination circuit 90 are:

R =50 Ohms; and

C =5.7 picoFarad.

The invention has now been described with respect to the preferred embodiments. Alternatives and substitutions will now be apparent to persons of ordinary skill in the art. Accordingly, it is not intended to limit the invention except as provided by the appended claims.

What is claimed is:

1. A method for forming a balun interface between a balanced input stage, having first and second output terminals, and an unbalanced output stage having a single ended input terminal for receiving a single ended input signal having a voltage level referenced to a ground voltage level, said method comprising the steps of:

providing a lumped parameter, parallel LC resonant circuit including an inductive element, having inductance L, comprising at least first, second, and third discrete, series connected inductors, each having first and second terminals and inductances of L1, L2, and L3, respectively, and a capacitance element, having first and second terminals and a capacitance of C, shunting the inductive element, with the first inductor having its first terminal coupled to the first terminal of the capacitance element at a first node and its second terminal coupled to the first terminal of the second inductor at a second node, and with the third inductor having its first terminal coupled to the second terminal of the second inductor at a third node and having its second terminal coupled to the second terminal of the capacitance element at a fourth node, and with the parallel LC circuit characterized by a resonant frequency equal to the inverse of 2pi multiplied by the square root of the product of L and C;

coupling the second node of said parallel LC circuit to the ground voltage level;

coupling the first and third-nodes to the output terminals of said balanced input stage to receive a balun input signal, provided by the balanced input stage, having an input signal bandwidth centered near the resonant frequency, with the balun input signal characterized by an odd mode excitation where input signal voltage levels at said first and third nodes have the same magnitude and opposite polarities with reference to the ground voltage level and an even mode excitation where the input signal voltage levels at the first and third nodes have the same polarity with reference to the ground voltage level;

coupling the fourth node to the single-ended input terminal of the unbalanced output stage to provide a single ended balun output signal with resonance of the LC parallel resonant circuit forcing substantially equal balanced and unbalanced port currents magnitudes and voltage magnitudes when an odd mode excitation balun input signal is received and to attenuate the voltage and current provided to the single-ended input when an even mode excitation balun input signal is received.

2. The method of claim 1 wherein:

the magnitude of L2 is greater than the magnitudes of L1 or L3.

3. The method of claim 1 further comprising the steps of:

providing a termination element, having first and second terminals, that absorbs common mode energy for frequencies in the input signal bandwidth; and wherein said step of coupling said second node includes the step of:

coupling said second node to the first terminal of said termination element; and coupling the second terminal of said termination element to said ground voltage level.

4. In a system including a balanced input stage for providing a balanced output signal and an unbalanced output stage for receiving a single-ended input signal, a balun interface having first and second input ports, for receiving said balanced output signal from the balanced input stage, and an output port, for providing said single-ended input signal to the unbalanced output stage, where the voltage levels of the balanced output signals and single-ended input signal are referenced to a ground voltage level, said balun interface comprising:

an inductive element, having inductance L, comprising at least first, second, and third discrete, series connected inductors, each having first and second terminals and inductances of L1, L2, and L3, respectively, with the first inductor having its first terminal coupled to a first node and second terminal coupled to a second node, with the second inductor having its first terminal coupled to said second node and its second terminal coupled to a third node, and with said third inductor having its first terminal coupled to said third node and its second terminal coupled to a fourth node; and a capacitance element, having first and second terminals and a capacitance of C, shunting the inductive element, with the capacitive element having its first terminal coupled to said first node and its second terminal coupled to said fourth node, and with the inductive element and the capacitive element forming a parallel LC circuit characterized by a resonant frequency equal to the inverse of 2pi multiplied by the square root of the product of L and C, with said first and third nodes receiving said balanced output signal, said second node coupled to the ground voltage level, and said fourth node providing said single-ended input signal.

5. The balun interface of claim 4 wherein said balun interface is integrated into a monolithic microwave integrated circuit (MMIC) having a major surface and wherein:

said first, second, and third inductors are formed of conductors disposed on the major surface of said MMIC; and said capacitor is a layered structure integrated into said MMIC.

\* \* \* \* \*